(12) United States Patent
Tsai et al.

(10) Patent No.: US 7,332,741 B2
(45) Date of Patent: Feb. 19, 2008

(54) MULTIDIRECTIONAL LEAKAGE PATH TEST STRUCTURE

(75) Inventors: Mon-Chin Tsai, Shanghai (CN); Xinghua Pu, Shanghai (CN); Ning Jiang, Shanghai (CN); Jun He, Shanghai (CN)

(73) Assignee: Grace Semiconductor Manufacturing Corporation, Shanghai (CN)

( * ) Notice: Subject to any disclaimer, the term of this patent is extended or adjusted under 35 U.S.C. 154(b) by 574 days.

(21) Appl. No.: 10/996,365

(22) Filed: Nov. 26, 2004

(65) Prior Publication Data

US 2006/0113532 A1    Jun. 1, 2006

(51) Int. Cl.
*H01L 29/40*    (2006.01)

(52) U.S. Cl. .......................................... 257/48
(58) Field of Classification Search .................. 257/48
See application file for complete search history.

(56) References Cited

U.S. PATENT DOCUMENTS 7,271,408 B2 *    9/2007    Kim et al. ..................... 257/48

* cited by examiner

*Primary Examiner*—Cuong Nguyen
(74) *Attorney, Agent, or Firm*—Rosenberg, Klein & Lee

(57) ABSTRACT

A test structure for testing a multidirectional current leakage path. A first doped region of a first conductivity is in the first well of the first conductivity in a substrate, in which the first doped region has a dopant concentration higher than the first well has. A first contact is on the first doped region and contacts the first doped region. The first contact has first and second portions respectively parallel to the first and second directions. A plurality of second doped regions of a second conductivity are in the first well and isolated from the first doped region. In a third direction, the second regions are adjacent to each another and isolate the first portion from the second portion. A plurality of second contacts are on the second doped regions and each one is corresponding to each the second doped region. With a relative shift between the first contact and the second doped region, the partial overlap is used in the test of a multidirectional leakage path.

17 Claims, 2 Drawing Sheets ly not limited except as specified in the accompanying claims.
MULTIDIRECTIONAL LEAKAGE PATH TEST STRUCTURE

BACKGROUND OF THE INVENTION

1. Field of the Invention

The present invention relates to a test structure, and more particularly to a test structure for testing multidirectional leakage path.

2. Description of the Prior Art

In a typical logic circuit, the fine pitch between a P type heavy doped region and N type heavy active region may cause the P type heavy doped region to shift towards the N type heavy active region in an N type well. The formation of leakage may result from the N type heavy active region close to the edges of the well when the N type heavy active region shifts in the same direction. However, typically only a one-dimensional test structure for leakage is used to test one-dimensional leakage. Thus, various types of test structures are necessary for the purpose of testing leakage in different directions, which is inefficient.

SUMMARY OF THE INVENTION

Accordingly, the present invention provides a multi-directional test structure in which contacts and doped regions are arranged for testing of multidirectional leakage path. The shift arrangement of the contacts and doped regions may test leakage paths in different directions.

According to the aspects of the present invention, one embodiment of the present invention provides a test structure for testing a multidirectional current leakage path. A first doped region of a first conductivity is in the first well of the first conductivity in a substrate, in which the first doped region has a dopant concentration higher than the first well has. A first contact is on the first doped region and contacts the first doped region. The first contact has a first and a second portion respectively parallel to the first and second directions. A plurality of second doped regions of a second conductivity are in the first well and isolated from the first doped region. In a third direction, the second regions are adjacent to each another and isolate the first portion from the second portion. A plurality of second contacts are on the second doped regions and each one corresponds to each second doped region.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 2 is a top-view diagram of FIG. 1, in which FIG. 1 is a view cut from AA' line.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Figure 1:
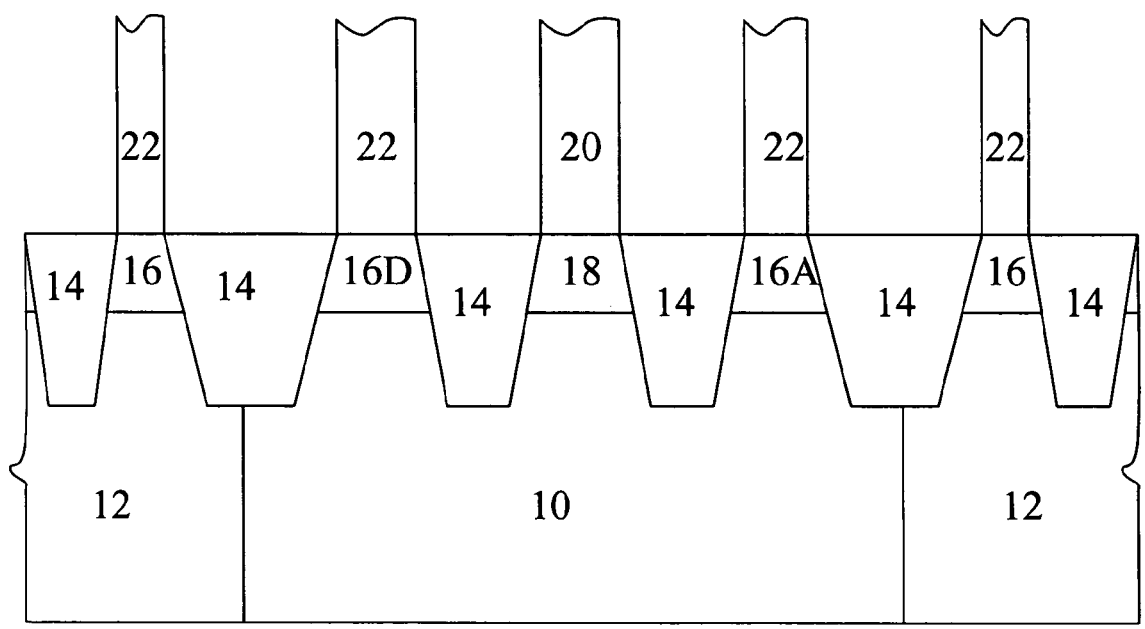
FIG. 1 is a cross-sectional diagram illustrating a test structure according to an embodiment of the present invention.

FIG. 1 is a cross-sectional diagram illustrating a test structure according to the present invention. A first contact 20 and a plurality of second contacts 22 are employed on a substrate (not shown). A first well 10 of a first conductivity is in the substrate and underlay the first contact 20 and some second contacts 22. A first doped region 18 of the first conductivity, whose dopant concentration is higher than one of the first well 10, is in the first well 10 and contacts the first contact 20. Some second doped regions 16A and 16D of a second conductivity are also in the first well 10. Each second doped region, in contact with each second contact 22, is isolated from the first doped region 18 by an isolating structure 14 (i.e. Shallow Trench Isolation, STI). Furthermore, the second conductivity is different from the first one. Additionally, there are some second wells 12 of the second conductivity outside the first well 10 in the substrate. Some second doped regions 16 are in the second 12 and connect an exterior voltage through the second contacts 22.

Figure 2:
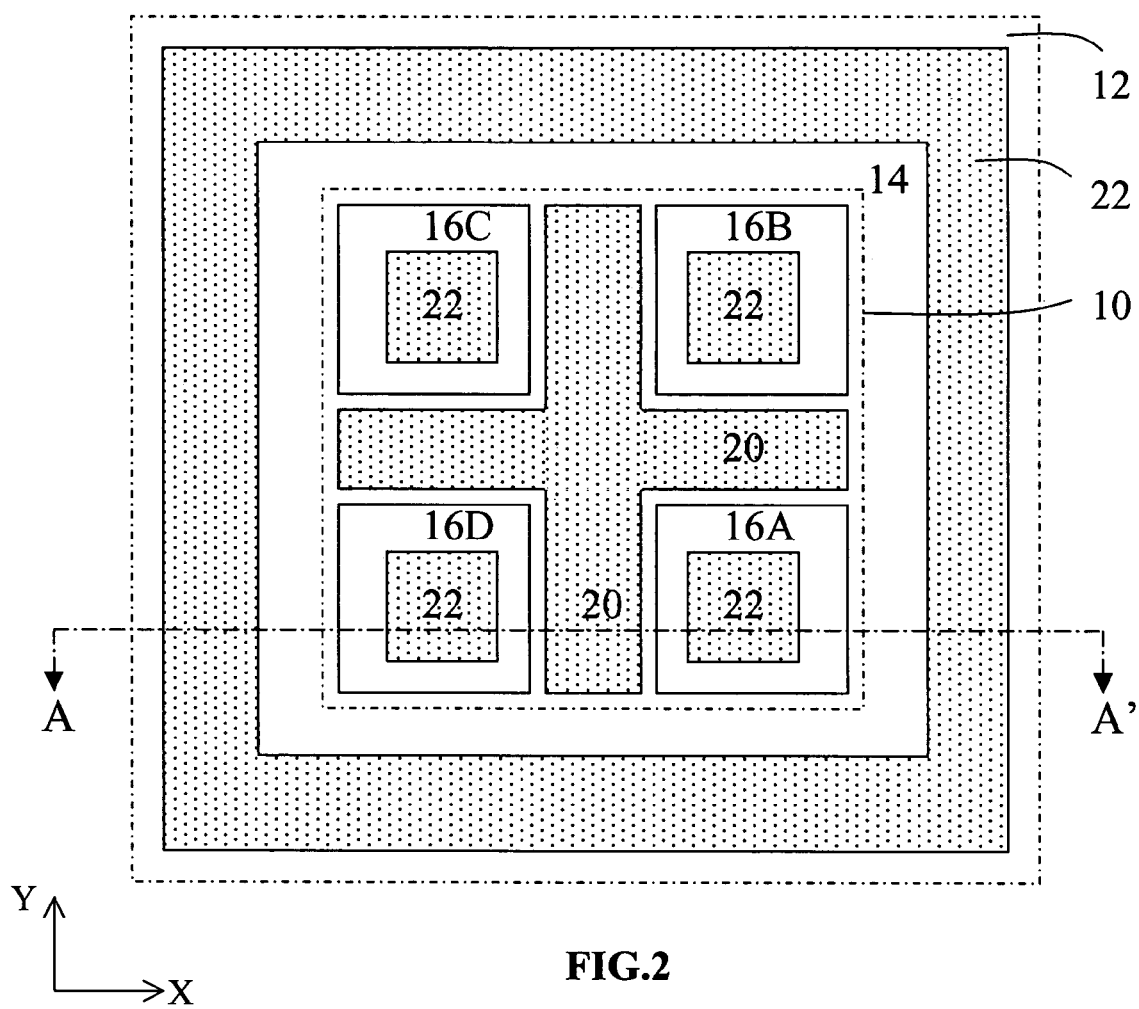

FIG. 2 is a top-view diagram of FIG. 1, in which FIG. 1 is a view cut from AA' line. Depicted in FIG. 2, the first contact 20 comprises a first portion and a second portion respectively parallel to a first direction (i.e. X direction) and a second direction (i.e. Y direction) different from the first one. Furthermore, it is noted that each second contact 22 is adjacent to both the first and the second portions of the first contact 20. It is to say that the second doped regions 16A, 16B, 16C, and 16D respectively underneath each second contact 22 are adjacent to but isolated (not overlap) from the first and the second portions of first contact 20, in the direction vertical to X-Y plane. According to such a structure of the present invention, the paths of current leakage in two directions are tested. However, a first well 10 and a second well 12 depicted as dash-line frames represent the position underneath other structures as solid lines. In an embodiment, the first doped region 18 contacting first contact 20 (located underneath first contact 20, not shown) may be an N type heavy doped region on condition that the first well 10 is an N type well of a dopant concentration less than the first doped region 18. On the other hand, the second doped regions 16A, 16B, 16C, and 16D contacting the second well 12 may be a P type heavy doped region on condition that the second well 12 is a P type well.

In application, the second doped region 16 outside of the first well 10 may be regarded as a pick-up region and connects an exterior voltage via the outside second contact 22. Moreover, the external potential may be applied on the first doped region 18 and the second doped regions 16A, 16B, 16C, and 16D via the first contact 20 or the other second contacts 22. For example for testing, when the first contact 20 shifts toward the first direction (i.e. X direction), the second portion of the first contact 20 (parallel to Y direction) may partially overlap the underneath second doped regions 16A and 16B (or 16C and 16D) in a vertical direction (vertical to X-Y plane). Thus, when the external voltage (grounded or non-zero voltage) is applied to the corresponding second doped region 16 via the second contact 22, the path of an induced current leakage, caused by the partial overlap of the second portion and the second doped regions 16A and 16B (or 16C and 16D) is monitored. Similarly, when the first contact 20 shifts toward the second direction (i.e. Y direction), the first portion of the first contact 20 (parallel to X direction) may partially overlap the underneath second doped regions 16A and 16D (or 16B and 16C) in a vertical direction (vertical to X-Y plane). Thus, when the external voltage (grounded or non-zero voltage) is applied to the corresponding second doped region 16 via the second contact 22, the path of an induced current leakage, caused by the partial overlap of the first portion and the second doped regions 16A and 16D (or 16B and 16C) is monitored.

Furthermore, the shifts of the second doped regions 16A, 16B, 16C, and 16D cause the partial overlap, which may be used for testing the current leakage path. Similarly, the first conductivity in FIG. 2 may be P-type, as well as an N-type of the second conductivity. However, the first well 10 and the second well 12 may be in an N type well of the substrate.

Accordingly, a test structure for testing a path of multi-directional current leakage is provided. A first well of a first conductivity is in a substrate. A first doped region of a first conductivity is in the first well. The first doped region has a first dopant concentration higher than the first well has. A first contact is on the first doped region and contacts the first doped region. The first contact has a first portion and a second portion respectively parallel to said first direction and said second direction. A plurality of second doped regions of a second conductivity are in the first well and isolate from the first doped region. In a third direction, the second regions are adjacent to each another and isolate the first portion from the second portion. A plurality of second contacts are on the second doped regions. Each second contact is corresponding to each second doped region, isolated from and adjacent to the first portion and said second portion.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A test structure for testing a path of multidirectional current leakage, wherein there are a first direction and a second direction different from the first direction, said test structure comprising:
    a first well of a first conductivity in a substrate;
    a first doped region of said first conductivity in said first well, wherein said first doped region has a first dopant concentration higher than said first well has;
    a first contact on said first doped region and contacting said first doped region, wherein said first contact has a first portion and a second portion respectively parallel to said first direction and said second direction;
    a plurality of second doped regions of a second conductivity in said first well and isolated from said first doped region, wherein in a third direction, said second regions are adjacent to each another and isolate said first portion from said second portion; and
    a plurality of second contacts on said second doped regions, wherein each said second contact is corresponding to each said second doped region.

2. The test structure in accordance with the claim 1, further comprising a pick-up region of said second conductivity outside said first well and in said substrate, wherein said pick-up region contacts an external voltage.

3. The test structure in accordance with the claim 2, further comprising a second well of said second conductivity in said substrate, contacting said first well and including said pick-up region, wherein said second well has a second dopant concentration lower than said second doped region and said pick-up region have.

4. The test structure in accordance with the claim 1, wherein when said first contact is of an offset position toward said first direction from a portion of said plurality of second doped regions, said second portion partially overlaps said portion of said plurality of second doped regions in said third direction, so as to be applied to a test of current leakage path.

5. The test structure in accordance with the claim 1, wherein when said first contact is of an offset position toward said second direction from a portion of said plurality of second doped regions, said first portion partially overlaps said portion of said plurality of second doped regions in said third direction, so as to be applied to a test of current leakage path.

6. The test structure in accordance with the claim 1, wherein said third direction is vertical to both said first and second directions.

7. A test structure for testing a path of multidirectional current leakage, wherein there are a first direction and a second direction different from the first direction, said test structure comprising:
    a first well of a first conductivity in a substrate;
    a first doped region of said first conductivity in said first well, wherein said first doped region has a first dopant concentration higher than said first well has;
    a first contact on said first doped region and contacting said first doped region, wherein said first contact has a first portion and a second portion respectively parallel to said first direction and said second direction;
    a plurality of second doped regions of a second conductivity in said first well and isolated from said first doped region, wherein in a third direction, said second regions adjacent to each another and isolate said first portion from said second portion; and
    a plurality of second contacts on said second doped regions, wherein each said second contact is corresponding to each said second doped region, isolated from and adjacent to said first portion and said second portion.

8. The test structure in accordance with the claim 7, further comprising a pick-up region of said second conductivity outside said first well and in said substrate, wherein said pick-up region contacts an external voltage.

9. The test structure in accordance with the claim 8, further comprising a second well of said second conductivity in said substrate, contacting said first well and including said pick-up region, wherein said second well has a second dopant concentration lower than said second doped region and said pick-up region have.

10. A test structure for testing a current leakage path, said test structure comprising:
    a first contact on a substrate, said first contact having a first portion parallel to a first direction and a second portion parallel to a second direction, wherein said first direction is different from said second direction;
    a plurality of second contacts on said substrate, each said second contact is isolated from said first contact and adjacent to both said first portion and said second portion;

a first well in said substrate and underlay said first and said second contacts, wherein said first well is of a first conductivity;

a first doped region in said first well and contacting with said first contact, wherein said first doped region is of said first conductivity and has a first dopant concentration higher than said first well has; and a plurality of second doped regions in said first well and isolated from said first doped region, wherein each said second doped region contacts each said second contact and is of a second conductivity different from said first conductivity.

11. The test structure in accordance with the claim 10, further comprising a third doped in said substrate outside said first well, of said second conductivity and contacting an external voltage.

12. The test structure in accordance with the claim 11, further comprising a second well in said substrate, of said second conductivity, contacting said first well and including said third doped region, wherein said second well has a second doped concentration less than said second and said third doped regions have.

13. The test structure in accordance with the claim 10, wherein in a third direction vertical to said first and second directions, any said second doped region is adjacent to and isolated from said first and said second potions.

14. The test structure in accordance with the claim 13, wherein the conditions that said first contact and a portion of said second doped regions have a relative shift in said first direction and said second portion and a portion of said second doped regions partially overlap are used for testing leakage path.

15. The test structure in accordance with the claim 13, wherein the condition of partial overlap includes two said second doped regions parallel to said second direction.

16. The test structure in accordance with the claim 13, wherein the condition of shift includes said first portion and a portion of said second doped regions partially overlap so as to use for testing leakage path.

17. The test structure in accordance with the claim 16, wherein the condition of partial overlap includes two said second doped regions parallel to said first direction.

* * * * *